(12) United States Patent
Ichihara (10) Patent No.: US 7,228,117 B2
(45) Date of Patent: Jun. 5, 2007

(54) FREQUENCY CORRECTION METHOD AND APPARATUS FOR CORRECTING SECULAR CHANGE

(75) Inventor: Masaki Ichihara, Tokyo (JP)

(73) Assignee: NEC Corporation (JP)

( * ) Notice: Subject to any disclaimer, the term of this patent is extended or adjusted under 35 U.S.C. 154(b) by 440 days.

(21) Appl. No.: 10/798,080

(22) Filed: Mar. 11, 2004

(65) Prior Publication Data

US 2004/0180630 A1  Sep. 16, 2004

(30) Foreign Application Priority Data

Mar. 12, 2003 (JP) .............. 2003-066565

(51) Int. Cl.
*H04B 1/18* (2006.01)
*H03L 1/00* (2006.01)

(52) U.S. Cl. ............. 455/192.2; 455/76; 455/259; 331/176

(58) Field of Classification Search ............ 455/75–76, 455/86–87, 118, 192.1, 192.2, 255–260, 265, 455/196.1; 375/344; 331/1 R, 18, 34, 66, 331/176, 177 R
See application file for complete search history.

(56) References Cited

U.S. PATENT DOCUMENTS

| | | | | |
|---|---|---|---|---|
| 4,633,422 A | * | 12/1986 | Brauer ................... | 702/106 |
| 5,774,800 A | * | 6/1998 | Mori ..................... | 455/255 |
| 5,875,388 A | * | 2/1999 | Daughtry et al. ......... | 455/67.11 |
| 6,233,292 B1 | | 5/2001 | Van Bezooijen et al. ... | 375/344 |
| 6,476,682 B1 | | 11/2002 | Cole et al. .............. | 331/176 |

FOREIGN PATENT DOCUMENTS

| | | |
|---|---|---|
| CN | 1236506 A | 11/1999 |
| EP | 0 834 994 | 9/1997 |
| EP | 0 834 994 A1 | 4/1998 |
| JP | 05-102955 | 4/1993 |
| JP | 06-326740 | 11/1994 |
| JP | 09-312584 | 12/1997 |
| JP | 10-28499773 | 10/1998 |
| JP | 2866086 | 12/1998 |
| JP | 11-154987 | 6/1999 |
| JP | 2001-077670 | 3/2001 |

(Continued)

OTHER PUBLICATIONS

Communication issued by European Patent Office on Mar. 23, 2006 in connection with corresponding European application No. EP 04 005 826.

(Continued)

*Primary Examiner*—Nguyen T. Vo
(74) *Attorney, Agent, or Firm*—Ostrolenk, Faber, Gerb & Soffen, LLP (57) ABSTRACT

In order to always maintain a frequency of an oscillator within a proper range, the frequency chages due to temperature and a secular change, a method is disclosed in which the secular change is calculated from past control information, and the frequency of the oscillator is corrected according to the secular change. A storing unit records the past control information for the oscillator. A processing unit calculates the secular change of the frequency of the oscillator from the past control information. Thereafter, the processing unit gives the oscillator new control information for correcting the calculated secular change.

38 Claims, 7 Drawing Sheets

FOREIGN PATENT DOCUMENTS

WO WO/98/58451 12/1998

OTHER PUBLICATIONS

*Adaptive Temperature Compensation of GPS Disciplined Quartz and Rubidium Oscillators*, B. Penrod, *IEEE Int'l Frequency Control Symposium*, 1996, pp. 980-987; XP000699046; XP010200002.
International Search Report dated Nov. 5, 2004.

Office Action issued by Chinese Patent Office on Jul. 14, 2006 in connection with corresponding Chinese application No. 2004-10008623.X.

English translation of Chinese Office Action dated Jul. 14, 2006 submitted in lieu of Statement of Relevancy of the present invention to the teachings of the cited prior art.

* cited by examiner

| address | temperature | control signal | time information |
|---|---|---|---|
| 0000 | Te(0) | DVc(0) | T(0) |
| 0001 | Te(1) | DVc(1) | T(1) |
| 0002 | Te(2) | DVc(2) | T(2) |
| 0003 | Te(3) | DVc(3) | T(3) |
| ... | ... | ... | ... |
| 000(N-1) | Te(N-1) | DVc(N-1) | T(N-1) |

Fig. 10

FREQUENCY CORRECTION METHOD AND APPARATUS FOR CORRECTING SECULAR CHANGE

BACKGROUND OF THE INVENTION

1. Field of the Invention

The present invention relates to a technique of correcting a frequency of an oscillator, and particularly to a technique of automatically correcting a frequency of a reference oscillator in a terminal of a mobile communication system using CDMA method or the like.

2. Description of the Related Art

In recent mobile communication, a high frequency band from 900 MHz to several GHz has been used. Therefore, even though a TCXO (temperature compensated crystal oscillator) having high precision such as a frequency error of almost 3.0 ppm is used as a reference oscillator, a frequency error of 3 kHz or above can occur. Therefore, a frequency deviation caused by the frequency error of the reference oscillator occurs between a transmitter and a receiver. When the frequency deviation between the transmitter and the receiver is enlarged, a signal received in the receiver cannot be correctly de-modulated.

When precision of TCXO used for the reference oscillator is heightened, the frequency deviation is lowered. However, the cost of a terminal is inevitably increased. Therefore, a technique has been conventionally proposed that the frequency deviation is lowered by adjusting a frequency oscillated by TCXO (For example, refer to Japanese Patent Application Publication No. H6-326740).

Figure 1:
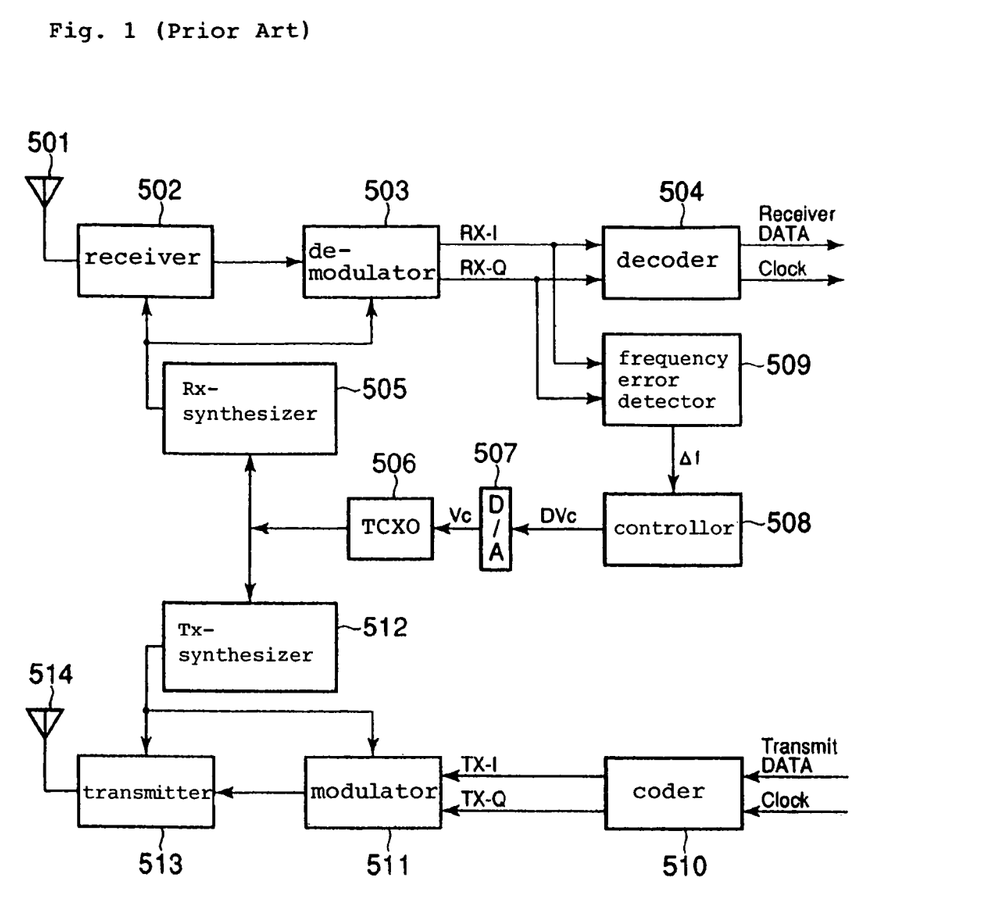
FIG. 1 is a block diagram showing a conventional typical mobile terminal.

Referring to FIG. 1, a conventional mobile terminal has antennas 501 and 514, receiver 502, de-modulator 503, decoder 504, RX-synthesizer 505, TCXO 506, D/A converter 507, controller 508, frequency error detector 509, coder 510, modulator 511, TX-synthesizer 512 and transmitter 513.

Receiver 502 converts a radio frequency signal transmitted from a base station (not shown) and received in antenna 501 to an intermediate frequency signal and transmits the intermediate frequency signal to de-modulator 503. Because receiver 502 uses a frequency signal obtained in RX-synthesizer 505 which uses a reference frequency of TCXO 506, a frequency of the intermediate frequency signal produced in receiver 502 includes an error based on an oscillation frequency error of TCXO 506.

De-modulator 503 de-modulates the intermediate frequency signal transmitted from receiver 502 and transmits obtained received base band signals (RX-I, RX-Q) to decoder 504 and frequency error detector 509.

Decoder 504 decodes the received base band signals and transmits obtained received DATA to a circuit (not shown) of a subsequent stage in synchronization with clock.

Frequency error detector 509 detects a frequency error $\Delta f$ from the received base band signals, for example, by measuring a difference in phase between slots, and transmits the frequency error $\Delta f$ to controller 508.

Controller 508 generates a frequency error compensating signal (hereinafter, simply named "control signal") DVc lowering the frequency error $\Delta f$ to a predetermined value or below and transmits the control signal DVc to D/A converter 507.

D/A converter 507 performs digital-to-analog conversion for the digital control signal DVc and gives such an obtained control voltage Vc to TCXO 506.

In TCXO 506, an oscillation frequency of a crystal oscillator (not shown) is controlled in voltage by using the control voltage Vc. TCXO 506 gives an oscillation frequency obtained by the control to RX-synthesizer 505 and TX-synthesizer 512 as a reference frequency.

By performing the control of controller 508 for TCXO 506 so as to lower the frequency error $\Delta f$ detected in frequency error detector 509 to the predetermined value or below, the reference frequency in TCXO 506 is synchronized with a received signal and is stabilized.

RX-synthesizer 505 generates a frequency signal of a desired frequency from the reference frequency and transmits the frequency signal to receiver 502 and de-modulator 503.

TX-synthesizer 512 generates a frequency signal of a desired frequency from the reference frequency and transmits the frequency signal to transmitter 513 and modulator 511.

Coder 510 receives Transmit DATA synchronized with clock from a circuit (not shown) at a preceding stage, codes the Transmit DATA and transmits the coded Transmit DATA to modulator 511 as transmit base band signals (TX-I, TX-Q).

Modulator 511 modulates the intermediate frequency signal with the transmit base band signals and then transmits it to transmitter 513.

Transmitter 513 converts the intermediate frequency signal transmitted from modulator 511 to a radio frequency signal and transmits the radio frequency signal to a base station (not shown) through antenna 514.

Figure 2:
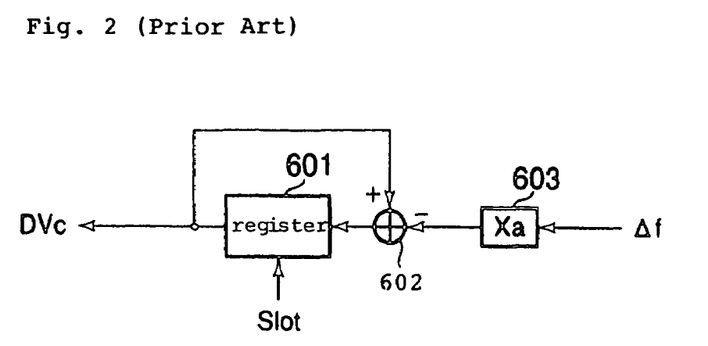
FIG. 2 is a block diagram showing a controller shown in FIG. 1.

Referring to FIG. 2, controller 508 has register 601, adder 602 and multiplier 603.

Multiplier 603 multiplies a signal of the frequency error $\Delta f$ by a coefficient "a" and transmits thus obtained signal to adder 602. Adder 602 adds an output of register 601 and an output of multiplier 603 with a predetermined adding polarity and transmits an obtained value to register 601. In the example of FIG. 2, adder 602 subtracts the output of multiplier 603 from the output of register 601.

Register 601 temporarily stores and delays an output of adder 602 and transmits the output to D/A converter 507 and adder 602. A summing circuit is composed of register 601 and adder 602, and outputs of multiplier 603 are summed in the summing circuit. A control signal DVc indicates a result of the summed outputs.

Figure 3:
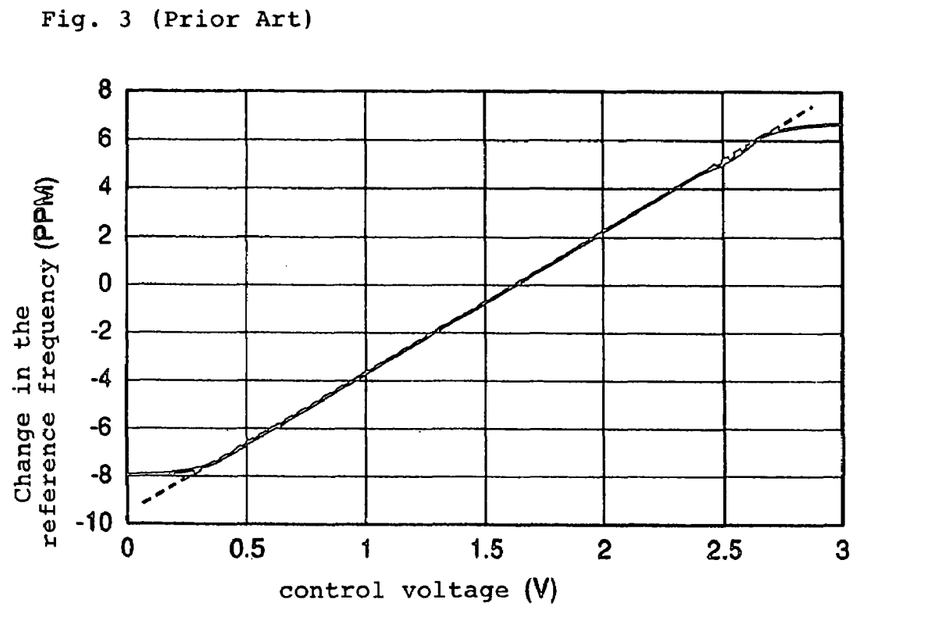
FIG. 3 is a graph showing an example of the relation between a control voltage and an amount of frequency change in a reference oscillator.

Referring to FIG. 3, the relation between the control voltage Vc given to TCXO 506 and an amount of change in the reference frequency based on the control voltage Vc can be expressed by a substantially straight line. Accordingly, when the adding polarity of adder 602 is correctly selected so as to lower the frequency error, the reference frequency in TCXO 506 can be converged so as to be synchronized with the received signal transmitted from a base station (not shown).

The configuration described above is a typical example of a frequency correction apparatus in a conventional mobile terminal. As described above, in the conventional mobile terminal, a frequency error is detected according to some method, the frequency error is given to a reference oscillator, and a reference frequency is corrected.

However, there exist the following problems in the above-described prior art.

In CDMA mobile communication represented by IS95 of the United States, a base station superposes frequency-spread signals of a plurality of channels on the same frequency. Further, a plurality of base stations use the same frequency, and each base station transmits signals of a plurality of channels of different spreading codes at the same frequency.

Therefore, electric waves are received in the mobile terminal with a plurality of channels transmitted from a plurality of base stations existing by mixture in the same frequency. In CDMA, this considerably differs from an analog method and a digital method of TDMA. Each of channels existing by mixture in the same frequency is distinguished by using a spreading code used for the corresponding frequency spreading.

Only when the mobile terminal performs complicated types of processing such as base station search, synchronization, frequency despreading and the like, the mobile terminal can extract a signal addressed to itself from signals of a plurality of channels existing by mixture in the same frequency. Further, only when the mobile terminal extracts a signal addressed to itself, the mobile terminal can detect an error (frequency deviation) between a frequency of the signal addressed to itself and a reference frequency of itself. Accordingly, in the mobile terminal of the CDMA mobile communication, unless the complicated processing are correctly performed in de-modulator 503, no frequency error can be detected in frequency error detector 509.

Further, to perform normally the complicated processing such as base station search, synchronization, frequency despreading and the like, an error of the reference frequency is required to be substantially small. To perform normally the complicated processing, a severe condition is given to the reference frequency in TCXO 506 that a deviation between the reference frequency and a frequency of a signal transmitted from a base station is, for example, within ±3.0 ppm.

When the reference frequency in TCXO 506 does not satisfy this condition, frequency error detector 509 cannot detect the frequency error, and the mobile terminal cannot correct the reference frequency.

Therefore, in order to start the correction of the reference frequency in the mobile terminal, even in condition that the correction to be performed by giving the frequency error detected in frequency error detector 509 to TCXO 506 is not performed, TCXO 506 is required to generate a reference frequency having precision which satisfies a severe condition such as with ±3.0 ppm.

As causes of changing a reference frequency oscillated by TCXO 506 and generating error, there are temperature and time changes.

As to the change of the reference frequency due to change of temperature, for example, even though an oscillator with the highest performance currently available is used as TCXO 506, there is a probability that a frequency change such as within ±2.0 ppm in the worst case occurs in a temperature range of −35° C. to +85° C. in which the mobile terminal should be guaranteed to be able to be operated.

Figure 4:
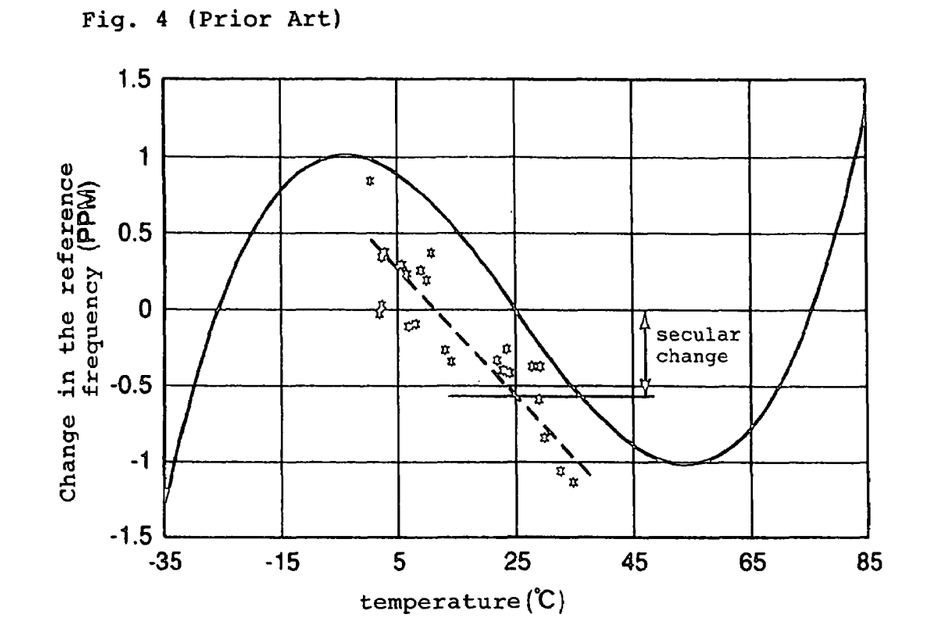
FIG. 4 is a graph showing an example of a temperature change of an oscillating frequency of a crystal oscillator used for the reference oscillator.

In FIG. 4, theoretical values of the change of the oscillation frequency due to change of temperature are shown by a solid line on condition that no secular change exists. In the example of FIG. 4, in case of no secular change, the oscillation frequency satisfies the condition that an amount of change is within ±3.0 ppm in a range of −35° C. to +85° C. centering around 25° C.

Figure 5:
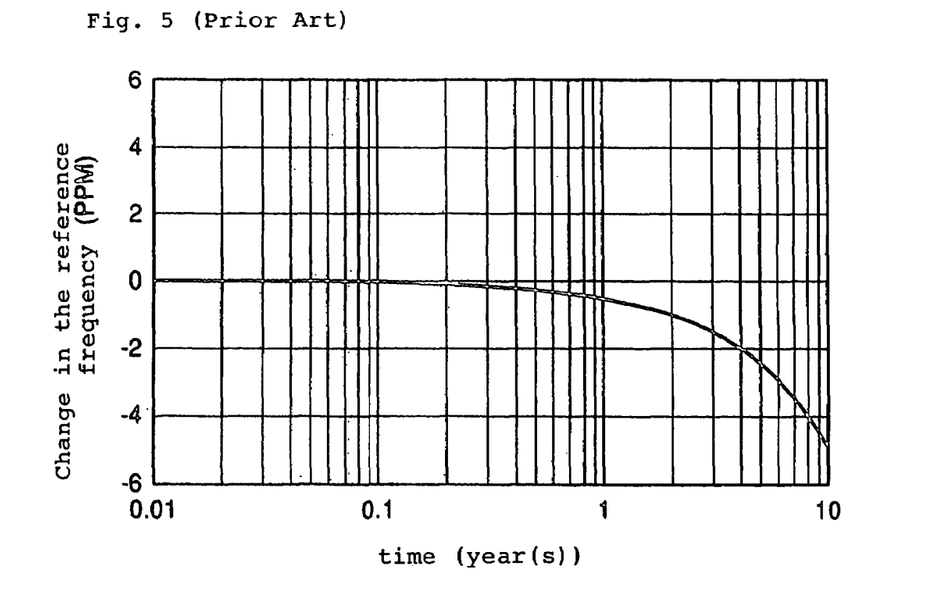
FIG. 5 is a graph showing an example of a secular change of an oscillating frequency of a crystal oscillator used for the reference oscillator.

In FIG. 5, a secular change of an oscillation frequency of a crystal oscillator is exemplarily shown in which the oscillation frequency is lowered by 0.5 ppm per year. Further, in order to show only influence of the secular change, influence of temperature is removed.

As shown in FIG. 5, even though the oscillation frequency of the crystal oscillator in TCXO 506 is correctly adjusted just before being shipped from the factory shipping time, when the crystal oscillator is used for a long term, the oscillation frequency changes due to a chemical change of the crystal oscillator. In the example of FIG. 5, the oscillation frequency becomes lower by 0.5 ppm in one year, 2.5 ppm in five years and 5.0 ppm in ten years.

Figure 6:
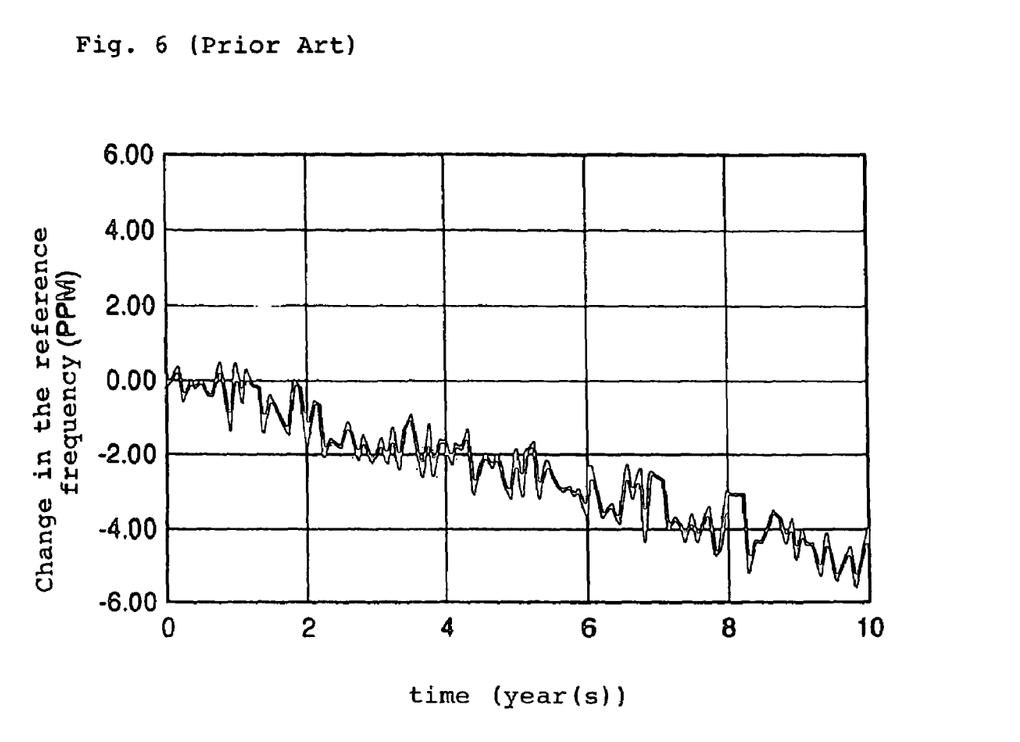
FIG. 6 is a graph showing an example of a change, obtained by superposing a temperature change on a secular change, of an oscillating frequency of a crystal oscillator used for the reference oscillator.

As shown in FIG. 6, in the oscillation frequency of the crystal oscillator, there is a short term change due to a temperature change superposing on a secular change gradually changing for a long term. As understood from FIG. 4, for example, the oscillation frequency changes due to influence of a temperature difference between night and daytime. When the crystal oscillator is placed out of doors in a cold area in winter, the crystal oscillator cooled to −10° C. or below is quite possible. When the crystal oscillator is placed in an automobile during daytime in midsummer, it is quite possible the crystal oscillator can become heated to 60° C. or above.

Further, the temperature of a mobile terminal is changed in dependence on operation conditions. When the mobile terminal is set in a power-off state, because there is no heat generated due to electric power consumption, the mobile terminal is sufficiently cooled at a time just after power turn-on and is set at a low temperature. However, when time has sufficiently elapsed after power turn-on, even though the mobile terminal is set in a standby state, temperature of the mobile terminal is elevated by heat generated due to electric power supply. Further, because a transmission amplifier is heated due to transmission of electric waves in a talking state, the mobile terminal is heated to a highest temperature. Furthermore, at a changing time of each state described above, there exists an unstable period in which temperature of the mobile terminal is transitionally changed. As described above, the oscillation frequency of the crystal oscillator of TCXO 506 frequently changes in a short period due to the temperature change.

In contrast, the oscillation frequency of the crystal oscillator is changed very slowly due to a secular change. For example, in a period of almost one month, a secular change of the oscillation frequency is very small and within range of a negligible error. However, like 2.5 ppm in five years in FIG. 5, when a secular change in several years is observed, the oscillation frequency has undoubtedly changed due to the secular change.

In a short period, an amount of change in the oscillation frequency is within range of about ±2.0 ppm due to the temperature change, and there is no problem in operation. However, in a long term, a secular change is added to the change of the oscillation frequency. Therefore, when four or five years have elapsed, an amount of change can be out of ±3.0 ppm, denoting an allowable range. When the time has further elapsed, the probability of the amount of change placed out of ±3.0 ppm is further heightened.

As described above, when the secular change of the crystal oscillator is left as it is, the reference frequency of TCXO 506 changes little by little, and the correction to be performed by giving the frequency error detected in frequency error detector 509 to TCXO 506 eventually cannot be performed. Therefore, when several years have elapsed after the shipping has begun, there is a probability that operational failure will occurs in a large number of mobile terminals.

As one of the countermeasures, an initial value of the control signal DVc for TCXO 506 at a time just after power turn-on is, for example, set to a convergent value previously obtained at a time before power turn-off. However, it is uncertain that temperature at the current time is almost the same as that at the previous time, and there is a probability that temperature at the current time considerably differs from that at the previous time. Accordingly, in case of this counter measure, in dependence on the temperature difference, there is a probability that conditions will become worse than those in case of no adoption of this countermeasure, is not adopted.

SUMMARY OF THE INVENTION

An object of the present invention is to provide frequency correction method and apparatus for always keeping a change in frequency of an oscillator due to a temperature change and a secular change within a proper range and to provide a mobile terminal in which a reference frequency can be always kept within a proper range.

To achieve the object, a frequency correction method according to the present invention is a frequency correction method for keeping a frequency of a controllable oscillator within a proper range and comprises first to third steps. In the first step, past control information for the oscillator is recorded. In the second step, a secular change of the frequency of the oscillator is calculated from the past control information. In the third step, new control information for correcting the calculated secular change is given to the oscillator.

Further, a frequency correction apparatus according to the present invention is a frequency correction apparatus for keeping a frequency of a controllable oscillator within a proper range and has storing means and processing means. The storing means records past control information for the oscillator. The processing means calculates a secular change of the frequency of the oscillator from the past control information and gives to the oscillator new control information for correcting the calculated secular change.

Furthermore, a mobile terminal according to the present invention has receiving means, local signal generating means, a reference oscillator, de-modulating means, frequency error detecting means, summing means, storing means, processing means and integrating means. The receiving means receives an electric wave from a base station. The local signal generating means supplies an oscillating local signal to the receiving means. The reference oscillator generates a reference signal of a frequency which is a reference for generating the local signal in the local signal generating means. The de-modulating means de-modulates a desired received signal from the electric wave received by the receiving means. The frequency error detecting means detects a frequency error of the reference oscillator on a basis of the received signal de-modulated by the de-modulating means. The summing means sums frequency errors detected by the frequency error detecting means and produces fundamental control information for correcting the frequency error. The storing means records past control information for the reference oscillator. The processing means calculates a secular change of a frequency of the reference oscillator from the past control information. The integrating means integrates the fundamental control information produced by the summing means and the secular change calculated by the processing means and gives to the reference oscillator new control information for correcting the frequency of the reference oscillator.

Preferably, the secular change may be calculated by using an approximate value obtained from an average of pieces of past control information.

Further, preferably, a temperature at a time when the past control information is decided may be recorded in correspondence to the past control information, and the secular change of the frequency of the oscillator may be calculated from the past control information and the temperature.

Furthermore, preferably, a relational expression of the past control information for temperatures placed within a predetermined range is decided according to approximation using discrete data of the past control information and temperatures, and the secular change may be calculated by using an approximate value which is obtained from the relational expression by setting a predetermined temperature of the predetermined range as a reference.

The above and other objects, features, and advantages of the present invention will become apparent from the following description with reference to the accompanying drawings which illustrate examples of the present invention.

EMBODIMENTS

An embodiment of the present invention will now be described with reference to the accompanying drawings.

As causes of changing a reference frequency of a mobile terminal of CDMA, there are a temperature change and a secular change of a crystal oscillator. When a change of the reference frequency combining the temperature change and the secular change can be placed within a predetermined allowable range (for example, within ±3.0 ppm), the mobile terminal can perform complicated processing such as base station search, synchronization, frequency despreading and the like. When such processing can be normally performed, the mobile terminal can perform a frequency correction operation by detecting an error between an extracted signal addressed to itself and the reference frequency of itself and giving the error to the reference oscillator.

When a crystal oscillator having some degree of precision is used, the temperature change among the temperature change and the secular change is placed within a predetermined temperature change range (for example, within ±2.0 ppm). Therefore, when the temperature change and the secular change are separated from each other and only the secular change is appropriately corrected, even though the mobile terminal is used for a long term, the reference frequency of the mobile terminal is not placed out of an allowable range.

Figure 7:
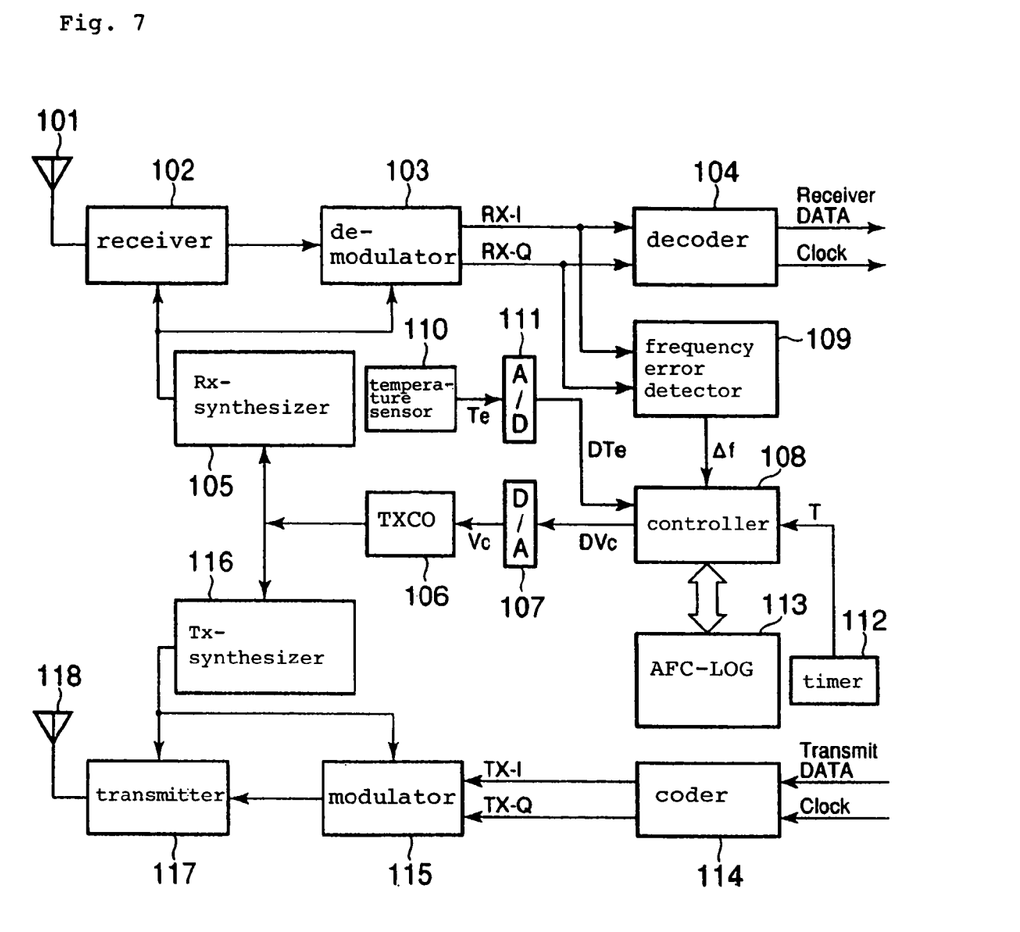
FIG. 7 is a block diagram showing a mobile terminal according to an embodiment of the present invention.

Referring to FIG. 7, the mobile terminal has antennas 101 and 118, receiver 102, de-modulator 103, decoder 104, RX-synthesizer 105, TCXO 106, D/A converter 107, controller 108, frequency error detector 109, temperature sensor 110, A/D converter 111, timer 112, past data memory (AFC-LOG) 113, coder 114, modulator 115, TX-synthesizer 116 and transmitter 117.

Receiver 102 converts a radio frequency signal transmitted from a base station (not shown) and received in the antenna 101 to an intermediate frequency signal, and transmits the signal to de-modulator 103. Because receiver 102 uses a frequency signal obtained in RX-synthesizer 105 which uses a reference frequency of TCXO 106, a frequency of the intermediate frequency signal produced in receiver 102 includes an error based on an oscillation frequency error of TCXO 106.

De-modulator 103 de-modulates the intermediate frequency signal transmitted from receiver 102 and transmits received base band signals (RX-I, RX-Q) thus obtained to decoder 104 and frequency error detector 109.

Decoder 104 decodes the received base band signals and transmits received DATA thus obtained to a circuit (not shown) at a subsequent stage in synchronization with clock.

Frequency error detector 109 detects a frequency error $\Delta f$ from the received base band signals, for example, by measuring a difference in phase between slots, and transmits the frequency error $\Delta f$ to controller 108. A frequency of the received signal is set as a target frequency of the control for TCXO 106, and the frequency error $\Delta f$ denotes a difference between the reference frequency generated in TCXO 106 and the target frequency.

Temperature sensor 110 measures a temperature Te in the neighborhood of TCXO 106 and transmits the temperature Te to A/D converter 111.

A/D converter 111 performs analog-to-digital conversion for an analog signal of the temperature Te and transmits temperature data DTe thus obtained to controller 108.

Timer 112 transmits time information T to controller 108.

Past data memory (AFC-LOG) 113 records values of a plurality of past control signals DVc obtained in controller 108, and pieces of time information T and pieces of temperature data DTe respectively at times when the values are obtained. The control signals DVc denotes control information used for controller 108 to control the frequency of TCXO 106. Because the controllable frequency of an oscillator is voltage normally controlled, each past control signal DVc denotes information indicating a controlled voltage.

Controller 108 corrects a secular change of the reference frequency according to the data, the temperature data DTe and the time information T recorded in AFC-LOG 113, and the frequency error $\Delta f$. Further the controller 108 generates a frequency error compensating signal (hereinafter, simply named "control signal") DVc lowering the frequency error $\Delta f$ to a predetermined value or below and transmits the control signal DVc to D/A converter 107.

D/A converter 107 performs digital-to-analog conversion for the digital control signal DVc and gives a control voltage Vc thus obtained to TCXO 106.

TCXO 106 voltage controls an oscillation frequency of a crystal oscillator (not shown) according to the control voltage Vc and gives an oscillation frequency obtained by the control to RX-synthesizer 105 and TX-synthesizer 116 as a reference frequency.

By performing the control of controller 108 for TCXO 106 so as to lower the frequency error $\Delta f$ detected in frequency error detector 109 to the predetermined value or below, the reference frequency in TCXO 106 is synchronized with the received signal and is stabilized.

RX-synthesizer 105 generates a local frequency signal oscillated at a desired frequency from the reference frequency and transmits the local frequency signal to receiver 102 and de-modulator 103.

TX-synthesizer 116 generates a local frequency signal oscillated at a desired frequency from the reference frequency and transmits the local frequency signal to transmitter 117 and modulator 115.

Coder 114 receives Transmit DATA synchronized with clock from a circuit (not shown) at a preceding stage, codes the transmit DATA and transmits the coded transmit DATA to modulator 115 as transmit base band signals (TX-I, TX-Q).

Modulator 115 modulates the frequency signal with the transmit base band signals and transmits an obtained intermediate frequency signal to transmitter 117.

Transmitter 117 converts the intermediate frequency signal transmitted from modulator 115 to a radio frequency signal and transmits the radio frequency signal to a base station (not shown) through antenna 118.

Figure 8:
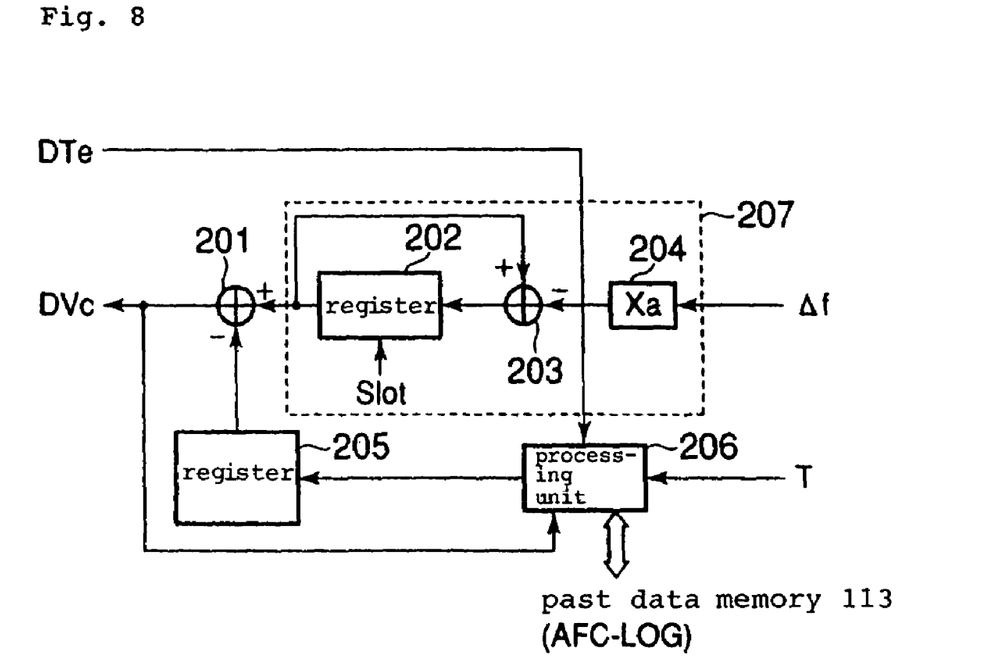
FIG. 8 is a block diagram showing a controller shown in FIG. 7.

Referring to FIG. 8, controller 108 has adders 201 and 203, registers 202 and 205, multiplier 204 and processing unit 206.

Multiplier 204 multiplies a signal of the frequency error $\Delta f$ by a coefficient "a" and transmits an obtained signal to adder 203.

Adder 203 adds an output of register 202 and an output of multiplier 204 with a predetermined adding polarity and transmits an obtained value to register 202. In the example of FIG. 8, adder 203 subtracts the output of multiplier 204 from the output of register 202. Register 202 temporarily stores and delays an output of adder 203 and transmits the output to adder 201 and adder 203. Summing circuit 207 is composed of multiplier 204, register 202 and adder 203, and frequency errors $\Delta f$ are summed in summing circuit 207. A signal obtained by summing the frequency errors $\Delta f$ denotes a signal indicating fundamental control information for correcting another frequency error $\Delta f$.

Adder 201 adds the output of register 202 and an output of register 205 with a predetermined adding polarity and transmits an obtained value to D/A converter 107 and processing unit 206 as the control signal DVc. Because the oscillating frequency of the crystal oscillator is lowered due to the secular change, adder 201 subtracts the output of register 205 denoting correction data of the secular change from an output of summing circuit 207.

Processing unit 206 writes data of the control signal DVc in AFC-LOG 113 with a temperature Te and time information T at this time and renews data of AFC-LOG 113. Thereafter, processing unit 206 calculates secular change correction data according to pieces of data recorded in AFC-LOG 113 and transmits the secular change correction data to register 205. Register 205 stores the secular change correction data and transmits the secular change correction data to adder 201.

Further, processing unit 206 may take temperature data DTe, the time information T and the control data DVc at the current time into consideration. Furthermore, when processing unit 206 calculates the secular change correction data, processing unit 206 may further take operation mode information of the mobile terminal into consideration. The operation mode information denotes information indicating an operation mode of the mobile terminal such as a standby mode, a call mode, a talking mode or the like.

Figure 9:
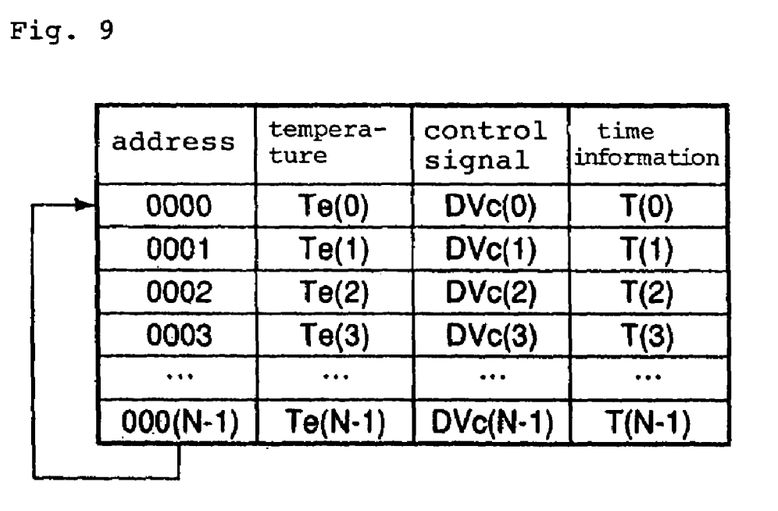
FIG. 9 is a view showing data recorded in an AFC-LOG.

Refer to FIG. 9, temperatures Te(i), control signals DVc(i) and time information T(i) (i is an integer, and i=0 to N−1) at past N times are stored in N address areas of AFC-LOG 113 from an address "0000" to an address "000(N−1)". In this example, an example of storing pieces of data from the address "0000" is shown for convenience. However, the present invention is not limited to this. When a leading address of a data storing area differs from "0000", the address of FIG. 9 may be considered as an offset value.

Figure 10:
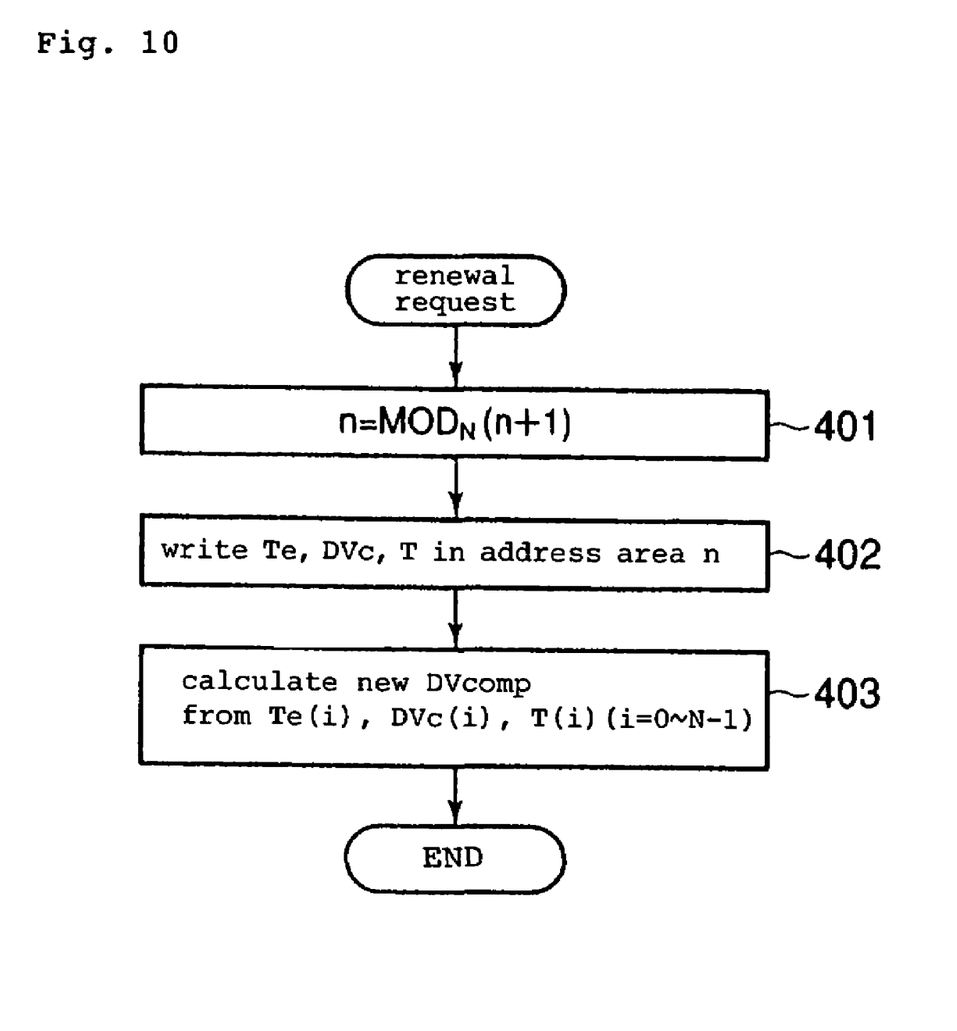
FIG. 10 is a flow chart showing the processing of both the renewal of the data of the AFC-LOG and the calculation of secular change correction data in a processing unit.

Refer to FIG. 10, processing unit 206 initially calculates an address n to be renewed at a subsequent time (step 401). The address n to be renewed is expressed by an integer cyclically changing at modulo N. When unity is added to a preceding value, the address n to be renewed at this time is obtained, and "0" is obtained after "N−1". That is, the address n is obtained according to the residue calculation to modulus n.

Thereafter, processing unit 206 writes a current temperature Te, a value of the control signal DVc and a current time T in the area of the address n and renews data of AFC-LOG 113 (step 402). Then, processing unit 206 calculates new secular change correction data DVcomp according to data recorded in AFC-LOG 113 (step 403).

An example of the calculation of the new secular change correction data DVcomp will be described.

When there is defined a control signal DVideal setting an amount of frequency change to zero in an ideal state in which no secular change exists, the secular change correction data DVcomp is expressed as follows.

$$DV_{comp} = DV_{ideal} - \frac{1}{N} * \sum_{i=0}^{N-1} DVc(i) \quad (1)$$

That is, a value obtained by subtracting an average value of past control signals DVc(0) to DVc(N−1) from the ideal control signal DVideal is set as the new secular change correction data DVcomp. As described above, when an average value of a plurality of (N) past control signals DVc is subtracted, a change due to the temperature change can be removed, and a change due to the secular change can be extracted. When the secular change is subtracted from the ideal control signal DVideal, secular change correction data can be calculated.

There are various methods of determining a renewal cycle or a renewal time of AFC-LOG 113 to preferably remove a change due to the secular change. For example, as a simple method, data of AFC-LOG 113 is renewed at equal intervals, for example, by performing the renewal at a predetermined time every day during one month. In this method, almost thirty pieces of data can be accumulated in one month, and the temperature change can be preferably removed. The renewal time of each day is not set to a time at which the highest temperature or the lowest temperature of the day tends to be obtained, but is set to a time at which an average temperature of the day tends to be obtained.

As described above, in this embodiment, processing unit 206 records a plurality of past control signals DVc in AFC-LOG 113, removes a change due to the temperature change from a control signal DVc by averaging the past control signals DVc, and extracts and corrects a change due to the secular change. Accordingly, the change due to the secular change can be accurately and stably corrected.

Further, even though the mobile terminal is used for a long term, the reference frequency can be kept within an allowable range.

Further, because the reference frequency can be always kept within the allowable range, de-modulator 103 can normally perform complicated processing such as base station search, synchronization, frequency despreading and the like, and frequency error detector 109 can detect a frequency error. Accordingly, the correction of the reference frequency can be always performed by giving the frequency error to TCXO 106.

In this embodiment, the secular change correction data DVcomp is calculated by subtracting the average value of the past control signals DVc from the ideal control signals DVideal. However, the present invention is not limited to this, and there exist other various methods of calculating the secular change correction data DVcomp.

For example, the temperature Te may be used to calculate the secular change correction data DVcomp. In this case, it is assumed that the relation between the temperature Te and the control signal DVc can be approximated by a linear equation within a predetermined temperature range, and an approximate linear equation is determined.

The approximate linear equation is set as follows.

$$DV_c = AT_e + B \quad (2)$$

A and B are calculated according to the least squares method by using discrete data composed of a plurality of past temperatures Te and a plurality of past control signals DVc. That is, A and B minimizing $$\sum_{i=0}^{N-1} E^2(i) = \sum_{i=0}^{N-1} [DV_c(i) - AT_e(i) - B]^2 \quad (3)$$

are calculated from $$A = \frac{N * \sum_{i=0}^{N-1} \{DV_c(i) * T_e(i)\} - \sum_{i=0}^{N-1} DV_c(i) * \sum_{j=0}^{N-1} T_e(j)}{N * \sum_{i=0}^{N-1} \{T_e(i)\}^2 - \left\{\sum_{i=0}^{N-1} T_e(i)\right\}^2} \quad (4)$$

$$B = \frac{\sum_{i=0}^{N-1} DV_c(i) * \sum_{j=0}^{N-1} \{T_e(j)\}^2 - \sum_{i=0}^{N-1} T_e(i) * \sum_{j=0}^{N-1} \{DV_c(j) * T_e(j)\}}{N * \sum_{i=0}^{N-1} \{T_e(i)\}^2 - \left\{\sum_{i=0}^{N-1} T_e(i)\right\}^2} \quad (5)$$

by using N pieces of data recorded in AFC-LOG 113.

Here, when an ideal temperature Teideal (for example, 25° C.) used as a reference is defined to correct the secular change, the secular change correction data DVcomp is expressed as follows.

$$DV_{comp} = DV_{ideal} - AT_{eideal} - B \quad (6)$$

That is, a value obtained by subtracting a value of the approximate linear equation determined according to the least squares method at the ideal temperature Teideal from the control signal DVideal setting an amount of frequency change to zero in an ideal state in which no secular change exists is set as secular change correction data DVcomp.

Processing unit 206 writes the secular change correction data DVcomp into register 206.

An example will be described hereinafter.

Referring to FIG. 4, theoretical values of the temperature change of the oscillating frequency in the state in which no secular change exists are indicated by a solid line. As understood from this solid line, an amount of frequency change with respect to temperature can be expressed by a substantially straight line within a temperature range actually used such as a range of −0° C. to +50° C. Further, as shown in FIG. 3, an amount of frequency change with respect to control voltage Vc can be expressed by an substantially straight line within an actual control range such as a range of −7 ppm to +6 ppm. Accordingly, it should be appreciated that the approximate linear equation (2) is effective in an actual use environment.

Further, in FIG. 4, an amount of frequency change obtained after the mobile terminal is used for several years is plotted by "*". As understood from FIG. 4, these plotted symbols indicate discrete values. However, when an approximate linear equation is calculated from the discrete values according to the least squares method, the amount of frequency change can be expressed by a straight line shown in FIG. 4 by a dotted line.

When the ideal temperature is set to 25° C., a difference in an amount of frequency change at 25° C. between the straight line derived from the approximate linear equation (2) and the dotted line indicates a value to be corrected as the secular change. A control voltage corresponding to this value is digitalized and is set as a control signal DVcomp.

When the calculation of the secular change correction data DVcomp described above is used, processing unit 206 records a plurality of past control signals DVc and the temperatures Te at those times in AFC-LOG 113, approximately expresses an amount of frequency change with respect to temperature by a linear equation from discrete values of data of AFC-LOG 113, removes a change due to the temperature change from the control signal DVc and extracts and corrects a change due to the secular change. Accordingly, even though the temperature environment in the use of the mobile terminal is fluctuated or biased, the change due to the secular change can be accurately and stably corrected by using the ideal temperature as a reference, and the reference frequency can be kept within the allowable range even after the mobile terminal is used for a long term. Therefore, for example, even though a mobile terminal used in midwinter in a cold area such as the central part of Hokkaido, Japan is brought to a high temperature area such as Okinawa, Japan because of travel or a business trip, the reference frequency of the reference oscillator can be kept within the allowable range, and the mobile terminal can be normally used.

Further, in this embodiment, as an example, a method is described in which data of AFC-LOG 113 is renewed once at a predetermined time every day during one month. However, the present invention is not limited to this, and other various renewal methods for AFC-LOG 113 can be adopted.

When the control voltage Vc is obtained and recorded, it is desired that temperature is stable. Further, the more temperatures recorded at times of obtaining a plurality of pieces of data are varied, the higher the precision in the approximation for the data can be.

Therefore, for example, at least one of following exemplary conditions 1 to 4 is arbitrarily selected, and the control voltage Vc is obtained when the selected exemplary condition(s) is/are satisfied. In this case, pieces of data set to a stable and stationary state at varied temperatures can be obtained.

(Exemplary condition 1) The temperature Te is observed every ten minutes, and the temperature change is less than 1° C. When this condition is satisfied, it is expected that temperature has reached the stationary state.

(Exemplary condition 2) Electric power is supplied after the power off state of the mobile terminal is continued for one hour or more, and the data obtaining time is just after a signal transmitted from a base station can be received. In this condition, pieces of data at comparatively low temperatures before increasing temperature can be obtained.

(Exemplary condition 3) The mobile terminal is set in the standby state for one hour. When this condition is satisfied, it is expected that temperature is placed in the stationary state.

(Exemplary condition 4) The mobile terminal continues data transmission for ten minutes or more. In this condition, because a power amplifier is heated, the temperature of the oscillator is heightened, and pieces of data at high temperatures can be obtained. The high temperature denotes a temperature near to an upper limit temperature at which the mobile terminal can be normally operated.

Further, when data of an obtained control voltage Vc becomes old, the secular change cannot be disregarded. Therefore, data obtained a predetermined period of time or above ago may be deleted according to the time information recorded in AFC-LOG 113, or the data may be removed when the secular change correction data DVcomp is calculated by processing unit 206.

Furthermore, there are various calculation methods of the secular change correction data DVcomp and various renewal methods of AFC-LOG 113. One of the methods can be arbitrarily selected, or one of the calculation methods and one of the renewal methods can be arbitrarily combined.

While preferred embodiments of the present invention have been described using specific terms, such description is for illustrative purposes only, and it is to be understood that changes and variations may be made without departing from the spirit or scope of the following claims.

What is claimed is:

1. A frequency correction method for keeping a frequency of a controllable oscillator within a proper range, the frequency correction method comprising:
    a first step of recording past control information for said oscillator;
    a second step of calculating a secular change of the frequency of said oscillator from the past control information; and
    a third step of giving to said oscillator new control information for correcting the calculated secular change wherein the past control information is recorded when a temperature of the oscillator is stationary, wherein, in the second step, the secular change is calculated by using an approximate value obtained from an average of pieces of the past control information, and
    wherein a difference between an ideal value predetermined on condition that the secular change does not exist and the approximate value is set as the secular change.

2. A frequency correction method for keeping a frequency of a controllable oscillator within a proper range, the frequency correction method comprising:
    a first step of recording past control information for said oscillator;

a second step of calculating a secular change of the frequency of said oscillator from the past control information; and a third step of giving to said oscillator new control information for correcting the calculated secular change wherein the past control information is recorded when a temperature of the oscillator is stationary, wherein the past control information is recorded when an operation of a circuit, which elevates a temperature of said oscillator to a high temperature by generating heat during the operation, is continuously stopped for a predetermined time or above.

3. The frequency correction method according to claim 2, wherein, in the second step, the secular change is calculated by using an approximate value obtained from an average of pieces of the past control information.

4. The frequency correction method according to claim 2, wherein:

in the first step, a temperature at a time at which the past control information is decided is recorded in the first step in correspondence to the past control information; and in the second step, the secular change of the frequency of said oscillator is calculated from the past control information and the temperature.

5. The frequency correction method according to claim 4, wherein, in the second step, a relational expression of the past control information for the temperature placed within a predetermined range is decided according to approximation using discrete data both of the past control information and the temperature, and the secular change is calculated by using an approximate value which is obtained from said relational expression by setting a predetermined temperature of within a predetermined range as a reference.

6. The frequency correction method according to claim 2, wherein, in the third step, the new control information for correcting the calculated secular change being integrated with an error between the frequency of said oscillator and a target frequency is given to said oscillator.

7. The frequency correction method according to claim 2, wherein, in the first step, the past control information is recorded every predetermined time.

8. The frequency correction method according to claim 2, wherein it is judged that the temperature of said oscillator is stationary when a change in a temperature periodically observed by a temperature sensor is smaller than a predetermined threshold, and the past control information is recorded.

9. The frequency correction method according to claim 2, wherein the past control information is recorded just after an operation of said oscillator is started from a state in which the operation of said oscillator is stopped for a predetermined time or above.

10. The frequency correction method according to claim 2, wherein, in the first step, a time at which the past control information is recorded is recorded in the first step in correspondence to said past control information, and the frequency correction method further comprises a fourth step of deleting said past control information when a predetermined time has elapsed after said past control information is recorded in the first step.

11. The frequency correction method according to claim 10, wherein, in the fourth step, the new control information is recorded in place of said past control information when said past control information is deleted.

12. The frequency correction method according to claim 2, wherein, in the first step, control information to be newly recorded is overwritten on one piece of the oldest past control information after the number of pieces of the past control information recorded reaches a predetermined number.

13. A frequency correction method for keeping a frequency of a controllable oscillator within a proper range, the frequency correction method comprising:

a first step of recording past control information for said oscillator;

a second step of calculating a secular change of the frequency of said oscillator from the past control information; and a third step of giving to said oscillator new control information for correcting the calculated secular change wherein the past control information is recorded when a temperature of the oscillator is stationary, wherein the past control information is recorded when a circuit, which elevates a temperature of the oscillator to a high temperature by generating heat during an operation, is continuously operated for a predetermined time or above.

14. A frequency correction apparatus for keeping a frequency of a controllable oscillator within a proper range, the frequency correction apparatus comprising:

storing means for recording past control information for said oscillator; and processing means for calculating a secular change of the frequency of said oscillator from the past control information recorded in said storing means and giving to said oscillator new control information for correcting the calculated secular change wherein the storing means records the past control information when a temperature of the oscillator is stationary, wherein said processing means calculates the secular change by using an approximate value obtained from an average of pieces of the past control information, and wherein a difference between an ideal value predetermined on condition that the secular change does not exist and the approximate value is set as the secular change.

15. A frequency correction apparatus for keeping a frequency of a controllable oscillator within a proper range, the frequency correction apparatus comprising:

storing means for recording past control information for said oscillator; and processing means for calculating a secular change of the frequency of said oscillator from the past control information recorded in said storing means and giving to said oscillator new control information for correcting the calculated secular change wherein the storing means records the past control information when a temperature of the oscillator is stationary, further comprising a circuit for elevating a temperature of said oscillator to a high temperature by generating heat during an operation, wherein said storing means records the past control information when the operation of said circuit is continuously stopped for a predetermined time or above.

16. A frequency correction apparatus for keeping a frequency of a controllable oscillator within a proper range, the frequency correction apparatus comprising:

storing means for recording past control information for said oscillator; and processing means for calculating a secular change of the frequency of said oscillator from the past control information recorded in said storing means and giving to said oscillator new control information for correcting the calculated secular change wherein the storing means records the past control information when a temperature of the oscillator is stationary, further comprising a circuit for elevating a temperature of said oscillator to a high temperature by generating heat during an operation,
wherein said storing means records the past control information when said circuit is continuously operated for a predetermined time or above.

17. The frequency correction apparatus according to claim 16, wherein said processing means calculates the secular change by using an approximate value obtained from an average of pieces of the past control information.

18. The frequency correction apparatus according to claim 16, wherein said storing means records a temperature at a time, at which the past control information is decided, in correspondence to said past control information, and said processing means calculates the secular change of the frequency of said oscillator from the past control information and the temperature.

19. The frequency correction apparatus according to claim 18, wherein said processing means decides a relational expression of the past control information for the temperature placed within a predetermined range according to approximation using discrete data both of the past control information and the temperature and calculates the secular change by using an approximate value which is obtained from said relational expression by setting a predetermined temperature within a predetermined range as a reference.

20. The frequency correction apparatus according to claim 16, further comprising:
frequency error detecting means for detecting an error between the frequency of said oscillator and a target frequency; and
integrating means for integrating a correction of the error detected by said frequency error detecting means with the new control information for correcting the secular change calculated by said processing means.

21. The frequency correction apparatus according to claim 16, wherein said storing means records the past control information every predetermined time.

22. The frequency correction apparatus according to claim 16, further comprising:
a temperature sensor for measuring the temperature of said oscillator,
wherein it is judged that the temperature of said oscillator is stationary when a change in the temperature periodically observed by said temperature sensor is smaller than a predetermined threshold, and said storing means records the past control information.

23. The frequency correction apparatus according to claim 16, wherein said storing means records the past control information just after an operation of said oscillator is started from a state in which the operation of said oscillator is stopped for a predetermined time or above.

24. The frequency correction apparatus according to claims 16, wherein said storing means records a time, at which the past control information is recorded, in correspondence to said past control information and deletes said past control information when a predetermined time has elapsed after recording of said past control information.

25. The frequency correction apparatus according to claim 24, wherein said storing means records the new control information in place of said past control information when said past control information is deleted.

26. The frequency correction apparatus according to claim 16, wherein said storing means overwrites control information to be newly recorded on one piece of the oldest past control information after the number of pieces of the past control information recorded reaches a predetermined number.

27. A mobile terminal, comprising:
receiving means for receiving an electric wave from a base station;
local signal generating means for supplying an oscillating local signal to said receiving means;
a reference oscillator for generating a reference signal of a frequency which is a reference for generating the local signal in said local signal generating means;
de-modulating means for de-modulating a desired received signal from the electric wave received by said receiving means;
frequency error detecting means for detecting a frequency error of said reference oscillator on a basis of the received signal de-modulated by said de-modulating means;
summing means for summing frequency errors detected one after another by said frequency error detecting means and produces fundamental control information for correcting the frequency error;
storing means for recording past control information for the reference oscillator;
processing means for calculating a secular change of a frequency of said reference oscillator from the past control information; and
integrating means for integrating the fundamental control information produced by said summing means and the secular change calculated by said processing means, and gives to said reference oscillator new control information for correcting the frequency of said reference oscillator wherein the storing means records the past control information when a temperature of the reference oscillator is stationary, wherein said processing means calculates the secular change by using an approximate value obtained from an average of pieces of the past control information, and
wherein said processing means sets a difference between an ideal value predetermined on condition that the secular change does not exist and the approximate value as the secular change.

28. A mobile terminal, comprising:
receiving means for receiving an electric wave from a base station;
local signal generating means for supplying an oscillating local signal to said receiving means;
a reference oscillator for generating a reference signal of a frequency which is a reference for generating the local signal in said local signal generating means;
de-modulating means for de-modulating a desired received signal from the electric wave received by said receiving means;
frequency error detecting means for detecting a frequency error of said reference oscillator on a basis of the received signal de-modulated by said de-modulating means;
summing means for summing frequency errors detected one after another by said frequency error detecting means and produces fundamental control information for correcting the frequency error;
storing means for recording past control information for the reference oscillator;
processing means for calculating a secular change of a frequency of said reference oscillator from the past control information; and integrating means for integrating the fundamental control information produced by said summing means and the secular change calculated by said processing means, and gives to said reference oscillator new control information for correcting the frequency of said reference oscillator wherein the storing means records the past control information when a temperature of the reference oscillator is stationary, further comprising a transmitting circuit for generating heat during transmission of the electric wave and elevating a temperature of the reference oscillator to a high temperature, wherein said storing means records the past control information when the transmitting circuit does not transmit an electric wave for a predetermined time or above.

29. The mobile terminal according to claim 28, wherein said processing means calculates the secular change by using an approximate value obtained from an average of pieces of the past control information.

30. The mobile terminal according to claim 28, wherein said storing means records a temperature at a time, at which the past control information is decided, in correspondence with said past control information, and said processing means calculates the secular change of the frequency of said reference oscillator from the past control information and the temperature.

31. The mobile terminal according to claim 30, wherein said processing means decides a relational expression of the past control information for the temperature placed within a predetermined range according to approximation using discrete data both of the past control information and the temperature and calculates the secular change by using an approximate value which is obtained from said relational expression by setting a predetermined temperature within a predetermined range as a reference.

32. The mobile terminal according to claim 28, wherein said storing means records the past control information every predetermined time.

33. The mobile terminal according to claim 28, further comprising a temperature sensor for measuring the temperature of said reference oscillator, wherein the temperature of said reference oscillator is stationary when a change in the temperature periodically observed by said temperature sensor is smaller than a predetermined threshold, and said storing means records the past control information.

34. The mobile terminal according to claim 28, wherein said storing means records the past control information just after a power off state set for a predetermined time or above is changed to a power on state.

35. The mobile terminal according to claims 28, wherein said storing means records a time, at which the past control information is recorded, in correspondence to said past control information and deletes said past control information when a predetermined time has elapsed after recording of said past control information.

36. The mobile terminal according to claim 35, wherein said storing means records the new control information in place of said past control information when said past control information is deleted.

37. The mobile terminal according to claim 28, wherein said storing means overwrites control information to be newly recorded on one piece of the oldest past control information after the number of pieces of the past control information recorded reaches a predetermined number.

38. A mobile terminal, comprising:

receiving means for receiving an electric wave from a base station;

local signal generating means for supplying an oscillating local signal to said receiving means;

a reference oscillator for generating a reference signal of a frequency which is a reference for generating the local signal in said local signal generating means;

de-modulating means for de-modulating a desired received signal from the electric wave received by said receiving means;

frequency error detecting means for detecting a frequency error of said reference oscillator on a basis of the received signal de-modulated by said de-modulating means;

summing means for summing frequency errors detected one after another by said frequency error detecting means and produces fundamental control information for correcting the frequency error;

storing means for recording past control information for the reference oscillator;

processing means for calculating a secular change of a frequency of said reference oscillator from the past control information; and integrating means for integrating the fundamental control information produced by said summing means and the secular change calculated by said processing means, and gives to said reference oscillator new control information for correcting the frequency of said reference oscillator wherein the storing means records the past control information when a temperature of the reference oscillator is stationary, further comprising a transmitting circuit for generating heat during transmission of the electric wave and elevating a temperature of the reference oscillator to a high temperature, wherein said storing means records the past control information when said transmitting circuit continuously transmits an electric wave for a predetermined time or above.

* * * * *